(12) United States Patent
Choi et al.

(10) Patent No.: US 10,566,484 B2
(45) Date of Patent: Feb. 18, 2020

(54) SOLAR CELL AND METHOD FOR MANUFACTURING THE SAME

(71) Applicant: LG ELECTRONICS INC., Seoul (KR)

(72) Inventors: Minho Choi, Seoul (KR); Hyunjung Park, Seoul (KR); Junghoon Choi, Seoul (KR); Youngho Choe, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/278,827

(22) Filed: May 15, 2014

(65) Prior Publication Data

US 2014/0338747 A1    Nov. 20, 2014

(30) Foreign Application Priority Data

May 16, 2013   (KR) .................. 10-2013-0055756

(51) Int. Cl.
*H01L 31/068* (2012.01)
*H01L 31/0224* (2006.01)
*H01L 31/0747* (2012.01)
*H01L 31/18* (2006.01)

(52) U.S. Cl.
CPC .. *H01L 31/0682* (2013.01); *H01L 31/022441* (2013.01); *H01L 31/0747* (2013.01); *H01L 31/1804* (2013.01); *Y02E 10/547* (2013.01); *Y02P 70/521* (2015.11)

(58) Field of Classification Search
CPC ......... H01L 31/022441; H01L 31/0747; H01L 31/1804; H01L 31/0682; Y02E 10/50; Y02E 10/547; Y02P 70/521

USPC .................................. 136/252, 258
See application file for complete search history.

(56) References Cited

U.S. PATENT DOCUMENTS

| | | | | |
|---|---|---|---|---|
| 4,496,788 A * | 1/1985 | Hamakawa | ....... | H01L 31/03685 136/249 |
| 5,401,336 A * | 3/1995 | Noguchi | ............. | H01L 31/0236 136/255 |
| 6,465,724 B1 * | 10/2002 | Garvison | ............... | F24J 2/5211 126/621 |
| 7,030,413 B2 * | 4/2006 | Nakamura | .......... | H01L 31/0745 136/243 |

(Continued)

FOREIGN PATENT DOCUMENTS

| CN | 102856328 A | 1/2013 |
|---|---|---|
| CN | 103107228 A | 5/2013 |

(Continued)

OTHER PUBLICATIONS

Shin et al. English machine translatiion of KR20120085072 published Jul. 31, 2012 (Year: 2012).*

*Primary Examiner* — Tamir Ayad
(74) *Attorney, Agent, or Firm* — Birch, Stewart, Kolasch & Birch, LLP

(57) ABSTRACT

Discussed is a solar cell including a semiconductor substrate including a base area and a doping area, a doping layer formed on the semiconductor substrate, the doping layer having a conductive type different from the doping area, a tunneling layer interposed between the doping layer and the semiconductor substrate, a first electrode connected to the doping area, and a second electrode connected to the doping layer.

14 Claims, 14 Drawing Sheets

(56) References Cited

U.S. PATENT DOCUMENTS

| | | | |
|---|---|---|---|
| 2005/0016585 A1* | 1/2005 | Munzer | H01L 31/03528 136/261 |
| 2011/0000532 A1* | 1/2011 | Niira | H01L 31/0747 136/255 |
| 2011/0201188 A1* | 8/2011 | Gupta | H01L 21/2254 438/530 |
| 2011/0284068 A1* | 11/2011 | Moslehi | H01L 31/02167 136/256 |
| 2012/0037224 A1 | 2/2012 | Fujikawa et al. | |
| 2012/0291860 A1 | 11/2012 | Park et al. | |
| 2013/0119374 A1 | 5/2013 | Kataishi et al. | |

FOREIGN PATENT DOCUMENTS

| | | | |
|---|---|---|---|
| KR | 20120085072 | * 7/2012 | ..... H01L 31/022441 |
| KR | 10-2012-0086593 A | 8/2012 | |
| KR | 10-2012-0129264 A | 11/2012 | |
| WO | WO 2010/142684 A2 | 12/2010 | |
| WO | WO 2012/173480 A2 | 12/2012 | |
| WO | WO 2013/161145 A1 | 10/2013 | |

* cited by examiner

SOLAR CELL AND METHOD FOR MANUFACTURING THE SAME

CROSS-REFERENCE TO RELATED APPLICATION

This application claims the priority benefit of Korean Patent Application No. 10-2013-0055756, filed on May 16, 2013 in the Korean Intellectual Property Office, the disclosure of which is incorporated herein by reference.

BACKGROUND OF THE INVENTION

1. Field of the Invention

The embodiments of the invention relate to a solar cell and a method for manufacturing the same and, more particularly, to a solar cell having an improved structure and a method for manufacturing the same.

2. Description of the Related Art

In recent years, as conventional energy resources such as petroleum and coal are expected to be depleted, interest in alternative energy resources to replace these energy resources is on the rise. Of these, solar cells are attracting considerable attention as next generation cells which convert solar energy into electrical energy.

Such a solar cell may be manufactured by forming various layers and electrodes according to a design. Solar cell efficiency may be determined according to the design of various layers and electrodes. Low efficiency should be overcome in order to commercialize the solar cells. Various layers and electrodes should be designed so that efficiency of the solar cells can be maximized.

SUMMARY OF THE INVENTION

It is an object of the embodiments of the invention to provide a solar cell and a method for manufacturing the same which are capable of improving reliability and maximizing efficiency.

In accordance with one aspect of the invention, the above and other objects can be accomplished by the provision of a solar cell including a semiconductor substrate including a base area and a doping area, a doping layer formed on the semiconductor substrate, the doping layer having a conductive type different from the doping area, a tunneling layer interposed between the doping layer and the semiconductor substrate, a first electrode connected to the doping area, and a second electrode connected to the doping layer.

In accordance with another aspect of the invention, provided is a method for manufacturing a solar cell, the method including preparing a semiconductor substrate, forming a tunneling layer on a surface of the semiconductor substrate, forming a doping layer on the tunneling layer, doping the semiconductor substrate with a dopant to form a doping area, and forming a first electrode and a second electrode connected to the doping area and the doping layer, respectively.

In the solar cell according to the embodiment of the invention, the doping area corresponding to the back surface field area, which may be formed to have a relatively small area, is formed on the semiconductor substrate and the doping layer having a relatively large area is formed on the tunneling layer. Based on this configuration, property or characteristics deterioration and damage of the semiconductor substrate, which may be generated during doping of the semiconductor substrate with a dopant, can be efficiently prevented or reduced. In addition, the doping layer and the doping area are separately formed in areas spaced from each other so that a shunt which may be generated when the doping layer is adjacent to the doping area is prevented. For this reason, open-circuit voltage (Voc) and fill factor of the solar cell are increased and efficiency of the solar cell is thus improved.

BRIEF DESCRIPTION OF THE DRAWINGS

The above and other objects, features and other advantages of the embodiments of the invention will be more clearly understood from the following detailed description taken in conjunction with the accompanying drawings, in which.

DETAILED DESCRIPTION OF THE EMBODIMENTS

Figure 1:
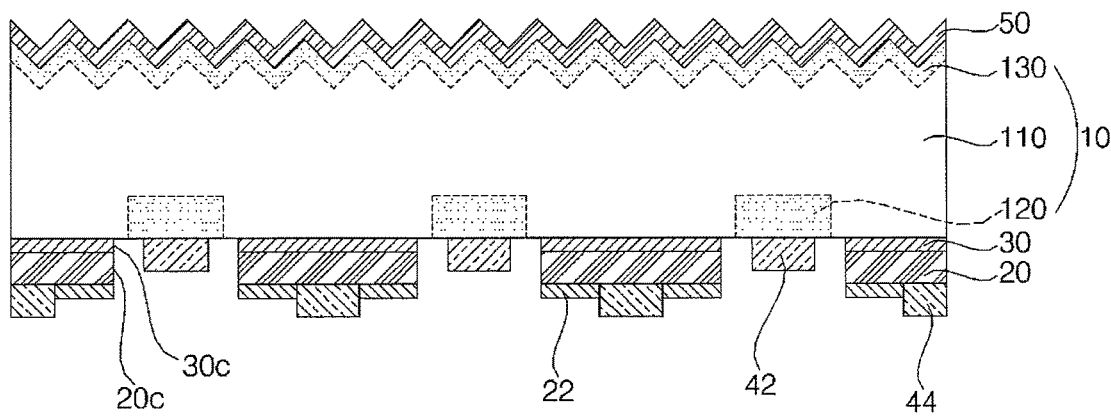
FIG. 1 is a sectional view of a solar cell according to an embodiment of the invention.

Reference will now be made in detail to the example embodiments of the invention, examples of which are illustrated in the accompanying drawings. The invention is not limited to the embodiments and the embodiments may be modified into various forms.

In the drawings, parts unrelated to the description are not illustrated for clear and brief description of the embodiments of the invention, and the same reference numbers will be used throughout the specification to refer to the same or considerably similar parts. In the drawings, the thickness or size is exaggerated or reduced for a more clear description. In addition, the size or area of each constituent element is not limited to that illustrated in the drawings.

It will be further understood that, throughout this specification, when one element is referred to as "comprising" another element, the term "comprising" specifies the presence of another element but does not preclude the presence of other additional elements, unless the context clearly indicates otherwise. In addition, it will be understood that when one element such as a layer, a film, a region or a plate is referred to as being "on" another element, the one element may be directly on the another element, and one or more intervening elements may also be present. In contrast, when one element such as a layer, a film, a region or a plate is referred to as being "directly on" another element, one or more intervening elements are not present.

Hereinafter, a solar cell and a method for manufacturing the same according to embodiments of the invention will be described in detail with reference to the annexed drawings.

FIG. 1 is a sectional view of a solar cell according to an embodiment of the invention.

Referring to FIG. 1, the solar cell 100 according to the embodiment of the invention includes a semiconductor substrate 10 including a base area 110 and a doping area 120, a doping layer 20 formed on the semiconductor substrate 10 and having a conductive type different from the doping area 120, a tunneling layer 30 interposed between the doping layer 20 and the semiconductor substrate 10, a first electrode 42 connected to the doping area 120, and a second electrode 44 connected to the doping layer 20. The base area 110 may have the same conductive type as the doping area 120 and the doping layer 20 may include a material and/or crystalline structure different from the semiconductor substrate 10. In addition, an anti-reflective film 50 may be further formed on another surface of the semiconductor substrate 10, and a barrier layer 22 may be formed on the doping layer 20. This configuration will be described in more detail.

More specifically, the semiconductor substrate 10 includes the base area 110 and the doping area 120 which include an identical first conductive-type dopant. In this instance, the doping area 120 is formed by doping with a high dose of a dopant having the same conductive type as the base area 110. A field effect in which movement of undesired carriers towards the doping area 120 is prevented is generated in the doping area 120. Accordingly, the doping area 120 corresponds to a back surface field (BSF) region. The shape of the doping area 120 or the like will be described in more detail with reference to FIG. 2.

The doping area 120 has the same material, crystalline structure and conductive type as the base area 110, but has a higher doping dose (or dopant concentration) than the base area 110. For example, the doping area 120 is formed by preparing a semiconductor substrate 10 including the base area 110 and then doping a portion of the semiconductor substrate 110 with a dopant. Doping methods include a variety of methods such as thermal diffusion or ion implantation. Through at least one of these methods, the semiconductor substrate 10 including the base area 110 and the doping area 120 can be formed.

A front surface field layer 130 may be entirely formed over the front surface of the semiconductor substrate 10 (that is, over the base area 110). The front surface field layer 130 is an area where the first conductive-type dopant is doped at a dose higher than the semiconductor substrate 10 and performs similar functions to the back surface field (BSF) area. That is, the front surface field layer 130 prevents electrons and holes separated by incident sunlight from being recombined and then decayed on the front surface of the semiconductor substrate 10. However, the embodiments of the invention are not limited to this feature, and the front surface field layer 130 may be omitted. This example will be described in more detail with reference to FIG. 9.

The base area 110 and the doping area 120 may, for example, include silicon containing a first conductive-type dopant. The silicon may be monocrystalline silicon, and the first conductive-type dopant may be, for example, an n-type or p-type dopant. That is, the first conductive-type dopant may be an n-type dopant such as a Group V element including phosphorous (P), arsenic (As), bismuth (Bi), antimony (Sb) or the like. Alternatively, the first conductive-type dopant may be a p-type dopant such as a Group III element including boron (B), aluminum (Al), gallium (Ga), indium (In) or the like.

When the base area 110 and the doping area 120 have an n-type dopant as the first conductive-type dopant, the doping layer 20 forming a tunnel junction through the base area 110 and the tunneling layer 30 may have a p-type. As a result, the doping layer 20 serving as an emitter causing photoelectric transformation through junction with the base area 110 may be widely formed and, as a result, holes having movement speed lower than electrons can be efficiently collected. Electrons created by photoelectric effect are collected by a first electrode 42 when light is emitted to the tunnel junction, and holes are moved toward the front surface of the semiconductor substrate 10 and are then collected by a second electrode 44. As a result, electric energy is generated, but the embodiments of the invention are not limited thereto, and the base area 110 and the doping area 120 may have a p-type while the doping layer 20 may have an n-type.

The front surface of the semiconductor substrate 10 is textured to have irregularities having a shape such as a pyramidal shape. When surface roughness is increased due to irregularities formed on the front surface of the semiconductor substrate 10 through such texturing, reflection of light incident through the front surface of the semiconductor substrate 10 can be reduced. Accordingly, an amount of light which reaches the tunnel junction formed by the semiconductor substrate 10 and the doping layer 20 is increased and light loss can thus be minimized.

In addition, the back surface of the semiconductor substrate 10 may be a smooth and even surface having a surface roughness lower than the front surface, obtained through mirror polishing or the like. When tunnel junction is formed through the tunneling layer 30 on the back surface of the semiconductor substrate 10, as in the embodiment of the invention, properties of the solar cell 100 may be greatly changed according to properties of the semiconductor substrate 10. For this reason, irregularities obtained by texturing are not formed on the back surface of the semiconductor substrate 10, but the embodiments of the invention are not limited thereto and a variety of modifications are possible.

In addition, an anti-reflective film 50 may be formed on the front surface field layer 130. The anti-reflective film 50 may be entirely formed over the front surface of the semiconductor substrate 10. The anti-reflective film 50 decreases reflectivity of light incident upon the front surface of the semiconductor substrate 10 and passivates defects present on the surface or in the bulk of the front surface field layer 130.

The decrease in reflectivity of light incident upon the front surface of the semiconductor substrate 10 causes an increase in an amount of light reaching the tunnel junction. Accordingly, a short current (Isc) of the solar cell 100 can be increased. In addition, the anti-reflective film 50 passivates defects, removes recombination sites of minority carriers and thus increases an open-circuit voltage (Voc) of the solar cell 100. As such, the anti-reflective film 50 increases the open-circuit voltage and the short current of the solar cell 100, thus improving conversion efficiency of the solar cell 100.

The anti-reflective film 50 may be formed of a variety of materials. For example, the anti-reflective film 50 may be a single film selected from the group consisting of a silicon nitride film, a silicon nitride film containing hydrogen, a silicon oxide film, a silicon oxide nitride film, $MgF_2$, ZnS, $TiO_2$ and $CeO_2$, or a multilayer film including a combination of two or more films, but the embodiments of the invention are not limited thereto and the anti-reflective film 50 may include a variety of materials.

In the embodiment of the invention, a tunneling layer 30 is formed on the back surface of the semiconductor substrate 10. The tunneling layer 30 improves interface properties of the back surface of the semiconductor substrate 10 and enables produced carriers to be efficiently transferred through a tunneling effect. The tunneling layer 30 may include a variety of materials enabling tunneling of carriers and examples of the materials include oxides, nitrides and conductive polymers.

In the embodiment of the invention, the tunneling layer 30 may be formed between at least the base area 110 and the doping layer 20. For example, in the embodiment of the invention, the tunneling layer 30 may have a shape corresponding to (that is, substantially the same as) the doping layer 20. Details of the shape will be described in more detail with reference to FIG. 2. The reason for the shape is that the overall process is simplified by etching the tunneling layer 30 and the doping layer 20 in the same process and a doping area 120 is formed through openings 30c and 20c formed in the tunneling layer 30 and the doping layer 20, but the embodiment of the invention is not limited thereto. That is, the tunneling layer 30 may be formed in a region other than a region where the doping layer 20 is formed, or in a region corresponding to the doping area 120 as well as the base area 110.

A thickness of the tunneling layer 30 may be 5.0 nm or less so that the tunneling layer 30 sufficiently exhibits a tunneling effect, or may be 0.5 nm to 5.0 nm (for example, 1.0 nm to 3.0 nm). When the thickness of the tunneling layer 30 exceeds 5.0 nm, tunneling is not efficiently performed and the solar cell 100 may not operate, and when the thickness of the tunneling layer 30 is less than 0.5 nm, there may be a difficulty in formation of the tunneling layer 30 with desired qualities. In order to further improve the tunneling effect, the thickness of the tunneling layer 30 may be 1.0 nm to 3.0 nm, but the embodiments of the invention are not limited thereto and the thickness of the tunneling layer 30 may be changed.

In addition, the doping layer 20 having a conductive type opposite to the semiconductor substrate 10 is formed on the tunneling layer 30. The doping layer 20 may include a semiconductor (for example, silicon) having a second conductive type dopant. The doping layer 20 may be formed by doping amorphous silicon, microcrystalline silicon or polycrystalline silicon with a second conductive type dopant by a variety of methods such as deposition or printing. In this instance, the second conductive type dopant may be any dopant having a conductive type opposite to the semiconductor substrate 10. That is, when the second conductive type dopant is a p-type dopant, a Group III element such as boron (B), aluminum (Al), gallium (Ga) or indium (In) may be used. When the second conductive type dopant is an n-type dopant, a Group V element such as phosphorus (P), arsenic (As), bismuth (Bi) or antimony (Sb) may be used. The doping layer 20 forms a tunnel junction with the base area 110 through the tunneling layer 30, thus substantially contributing to photoelectric transformation.

In this instance, the tunneling layer 30 and the doping layer 20 are provided with openings 30c and 20c, respectively, to open regions corresponding to the doping area 120.

A barrier layer 22 which prevents contamination of the doping layer 20 or the like and aids in formation of the doping area 120 may be disposed on the doping layer 20, when the doping area 120 is formed. Such a barrier layer 22 will be described again with reference to FIGS. 3A to 3G later. The barrier layer 22 is not required to be formed and may be not formed according to manufacturing method or the like.

The first electrode 42 is formed on the semiconductor substrate 10 such that the first electrode 42 is connected to the doping area 120 and the second electrode 44 passes through the barrier layer 22 on the doping layer 20 such that the second electrode 44 is connected to the doping layer 20. The first and second electrodes 42 and 44 may include a variety of metal materials. In addition, the first and second electrodes 42 and 44 may have a variety of plane shapes which are not electrically connected to each other, but are connected to the doping area 120 and the doping layer 20, respectively, to collect produced carriers and transport the same to the outside. That is, the embodiments of the invention are not limited to plane shapes of the first and second electrodes 42 and 44.

In embodiments of the invention, the first electrode 42 is disposed closer to the substrate 10 than the second electrode 44. That is, the first electrode 42 is disposed on the substrate 10 without intervention of at least one of the tunneling layer 30, the doping layer 20 and the barrier layer 22. On the other hand, the second electrode 44 is disposed on the substrate 10 with the intervention of at least one of the tunneling layer 30, the doping layer 20. In embodiments of the invention, the second electrode 44 is disposed on the doping layer 20. In another embodiment, the second electrode 44 may be disposed on both of the doping layer 20 and the barrier layer 22. More particularly, the second electrode 44 may be disposed on (for example, directly disposed on) the doping layer 20 inside an opening of the barrier layer 22 (that is, the second electrode 44 may be disposed on (for example, directly disposed on) the doping layer 20 and side surfaces of the opening of the barrier layer 22) and on the barrier layer 22 near the opening of the barrier layer 22. In such instance, the first electrode 42 is recessed relative to the second electrode 44.

Figure 2:
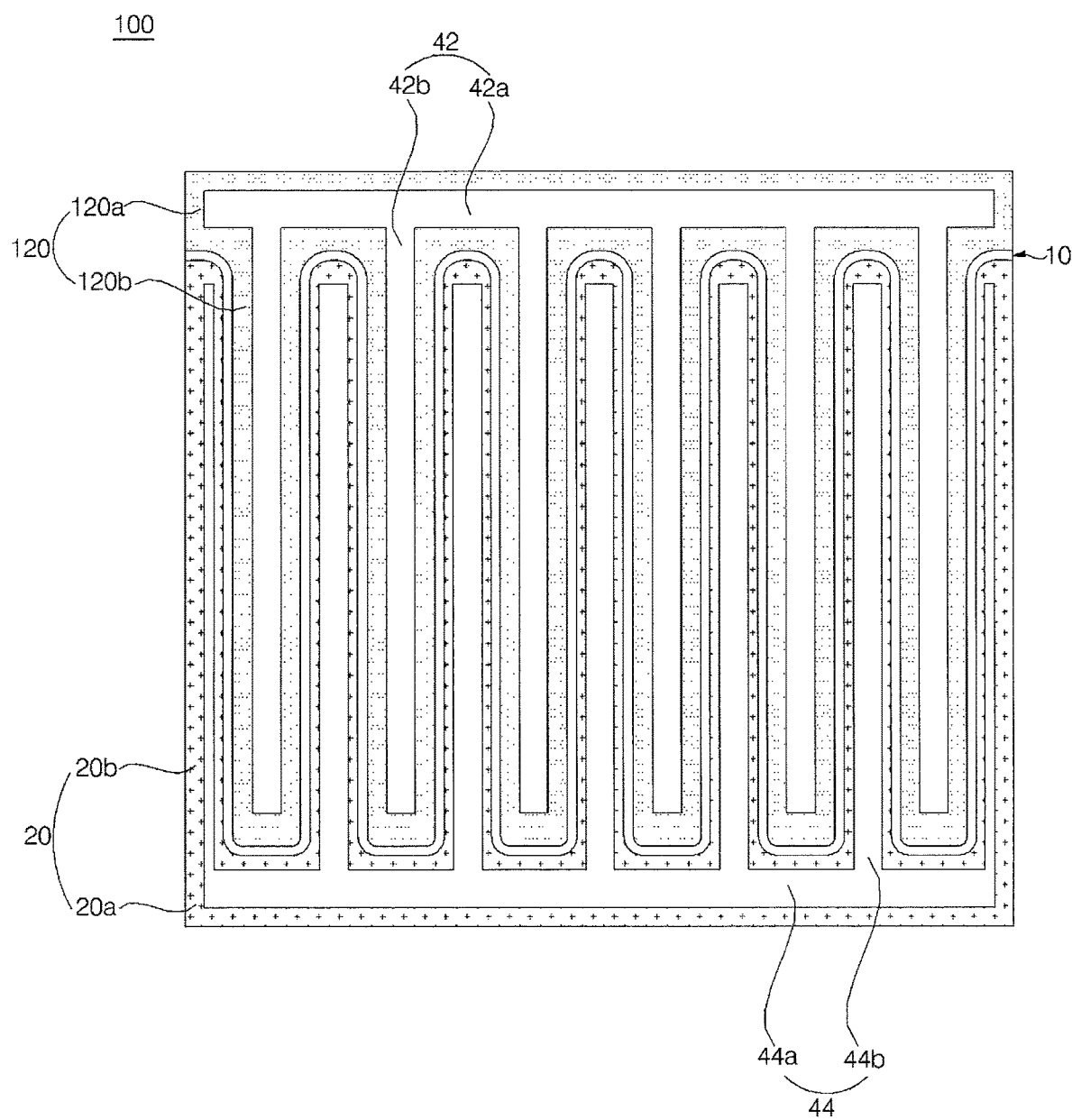
FIG. 2 is a back plane view illustrating the solar cell shown in FIG. 1.

Hereinafter, the plane configuration of the semiconductor substrate 10 including the base area 110 and the doping area 120, the doping layer 20, the tunneling layer 30, and the first and second electrodes 42 and 44 will be described in detail with reference to FIG. 2. FIG. 2 is a back plane view illustrating the solar cell 100 according to the embodiment of the invention. The configuration of the first and second electrodes 42 and 44 shown in FIG. 2 is provided only as an example and the embodiments of the invention are not limited thereto.

Referring to FIG. 2, in the solar cell 100 according to the embodiment, the doping area 120 is formed to be narrower than the doping layer 20. As a result, the tunnel junction formed through the tunneling layer 30 between the semiconductor substrate 110 and the doping layer 20 can be widened. As described above, when the base area 110 and the doping area 120 have an n-conductive type and the doping layer 20 has a p-conductive type, holes having a low movement speed can be efficiently collected.

For this purpose, the doping area 120 may include a first stem portion 120a formed along a first edge (upper edge in the drawing) of the semiconductor substrate 10 and a plurality of first branch portions 120b which extend from the stem portion 120a toward a second edge (lower edge in the drawing) opposite to the first edge. The plurality of first branch portions 120b are aligned to be parallel to each other to have a shape of a stripe pattern. The doping layer 20 may include a second stem portion 20a formed along the second edge of the semiconductor substrate 110 and a plurality of second branch portions 20b which extend between the first branch portions 120b toward the first edge from the second stem portion 20a. The plurality of second branch portions 20b are aligned to be parallel to each other to have a shape of a stripe pattern. The first branch portions 120b of the doping area 120 and the second branch portions 20b of the doping layer 20 may be alternately disposed. In addition, the tunneling layer 30 may have the same shape as or a similar shape to the doping layer 20 and be thus formed to have portions corresponding to the second stem portion 20a and the second branch portion 20b.

Areas of the doping area 120 and the doping layer 20 may be controlled by varying widths of the first and second stem portions 120a and 20a and/or the first and second branch portions 120b and 20b. That is, the width of the first stem portion 120a may be smaller than that of the second stem portion 20a, and/or the width of the first branch portion 120b may be smaller than that of the second branch portion 20b.

For example, a ratio of the total area of the doping area 120 to the total area of the solar cell 100 may be 0.5% to 30% (more preferably 0.5% to 5%). When the ratio of the total area of the doping area 120 is less than 0.5%, contact between the doping area 120 and the first electrode 42 is not accurately formed and contact resistance between the doping area 120 and the first electrode 42 may thus be increased. When the area ratio exceeds 30%, the area of the doping layer 20 is decreased and efficiency of the solar cell 100 is thus deteriorated, as described above. The area ratio is preferably, but not necessarily, 0.5% to 5% in consideration of efficiency of the solar cell.

The first electrode 42 may include a stem portion 42a corresponding to the first stem portion 120a of the doping area 120 and a branch portion 42b corresponding to the first branch portion 120b of the doping area 120. Similarly, the second electrode 44 may include a stem portion 44a corresponding to the second stem portion 20a of the doping layer 20 and a branch portion 44b corresponding to the second branch portion 20b of the doping layer 20, but the embodiments of the invention are not limited thereto and the first electrode 42 and the second electrode 44 may have a variety of plane shapes.

In the embodiment, it is exemplified that the doping area 120 has the first stem portion 120a, the doping layer 20 has the second stem portion 20a, the first electrode 42 has the stem portion 42a, and the second electrode 44 has the stem portion 44a. However, the embodiments of the invention are not limited thereto, and the first and second stem portions 120a and 20a, and the stem portions 42a and 44a are not required. Therefore, one or more of the first stem portions 120a, the second stem portion 20a, the stem portion 42a and stem portion 44a may be not formed or may be not included.

Based on this configuration, the first electrode 42 entirely contacts a portion of the doping area 120 where the doping layer 20 is not formed, and the second electrode 44 entirely contacts a portion of the doping area 120 where the doping layer 20 is formed. Accordingly, the region of the doping layer 20 is sufficiently secured, and the doping area 120 and the first electrode 42 are spaced from each other, and the doping layer 20 and the second electrode 44 are spaced from each other. As a result, an electrical connection between the doping area 120 and the first electrode 42 and an electrical connection between the doping layer 20 and the second electrode 44 can be stably formed. In addition, additional layers for insulating the doping area 120 from the first electrode 42 and for insulating the doping layer 20 from the second electrode 44 are not required and structure and manufacturing process can thus be simplified. However, insulating layers for insulating the doping area 120 from the first electrode 42 and the doping layer 20 from the second electrode 44 to improve insulating properties may be formed.

In the solar cell 100 according to the embodiment of the invention, the doping area 120 corresponding to the back surface field area which may be formed to have a relatively small area is formed on the semiconductor substrate 10 and the doping layer 20 which needs to have a relatively large area is formed on the tunneling layer 30. Based on this configuration, property or characteristics deterioration and damage of the semiconductor substrate 10, which may be generated during doping of the semiconductor substrate 10 with a dopant, can be efficiently prevented or reduced. In addition, the doping layer 20 and the doping area 120 are separately formed in areas spaced from each other so that a shunt which may be generated when the doping layer 20 is adjacent to the doping area 120 is prevented. For this reason, open-circuit voltage (Voc) and fill factor of the solar cell 100 are increased and efficiency of the solar cell 100 is thus improved.

The solar cell 100 according to the embodiment may be formed by a variety of methods and the formation method will be described in more detail with reference to FIGS. 3A to 3G, and FIGS. 4A to 4I. Hereinafter, details of the description already given above are not repeated and only difference from the description given above is described in detail.

FIGS. 3A to 3G are sectional views illustrating a method for manufacturing the solar cell according to an embodiment of the invention.

Figure 3A:
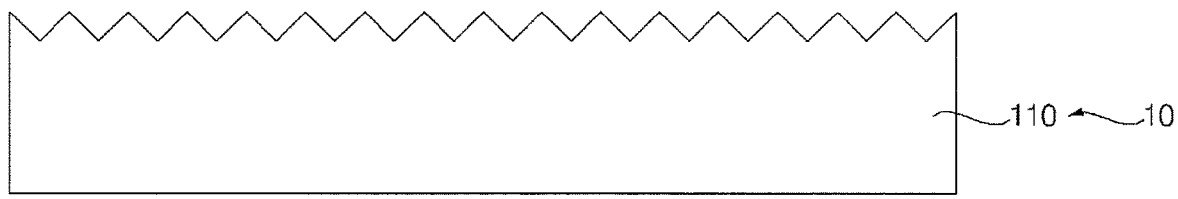
FIGS. 3A to 3G are sectional views illustrating a method for manufacturing a solar cell according to an embodiment of the invention.

First, as shown in FIG. 3A, a semiconductor substrate 10 including a base area 110 having a first conductive-type dopant is prepared in preparation of the substrate. In the embodiment of the invention, the semiconductor substrate 10 may include silicon having an n-type dopant. Examples of the n-type dopant include Group V elements such as phosphorous (P), arsenic (As), bismuth (Bi) and antimony (Sb).

The front surface of the semiconductor substrate 10 is textured so that the front surface has irregularities and the back surface of the semiconductor substrate 10 is subjected to treatment such as mirror polishing so that the back surface of the semiconductor substrate 10 has a lower surface roughness than the front surface thereof. In embodiments of the invention, the back surface may have a flat surface.

Wet or dry texturing may be used as the texturing of the front surface of the semiconductor substrate 10. Wet texturing may be carried out by dipping the semiconductor substrate 10 in a texturing solution and has an advantage of a short process time. Dry texturing is a process of cutting the surface of the semiconductor substrate 10 using a diamond drill, laser or the like and enables formation of uniform irregularities, but disadvantageously has a long process time and causes damage to the semiconductor substrate 10. Alternatively, the semiconductor substrate 10 may be textured by a reactive ion etching (RIE) or the like. As such, the semiconductor substrate 10 may be textured by a variety of methods. In addition, the back surface of the semiconductor substrate may be treated by a known mirror surface polishing method.

Figure 3B:
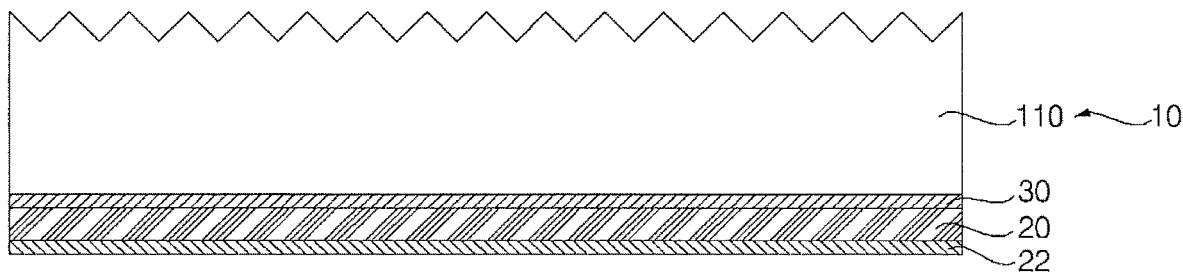

Next, as shown in FIG. 3B, a tunneling layer 30 and a doping layer 20 are formed on the back surface of the semiconductor substrate 10. At this time, a barrier layer 22 may be further formed on the doping layer 20.

The tunneling layer 30 may be formed by a method such as thermal growth or deposition (for example, plasma-enhanced chemical vapor deposition chemical (PECVD), atomic layer deposition (ALD)) or the like, but the embodiments of the invention are not limited thereto and the tunneling layer 30 may be formed by a variety of methods. The doping layer 20 includes a microcrystalline, amorphous or polycrystalline semiconductor having a second conductive type dopant. The doping layer 20 may be formed by forming a microcrystalline, amorphous or polycrystalline semiconductor by thermal growth, deposition (for example, plasma-enhanced chemical vapor deposition chemical (PECVD)) or the like, and then doping the semiconductor with a second conductive type dopant. Alternatively, the doping layer 20 may be formed by doping with the second conductive type dopant while forming a microcrystalline, amorphous or polycrystalline semiconductor through injection of a substance including a second conductive type dopant in the process of thermal growth, deposition (for example, plasma-enhanced chemical vapor deposition chemical (PECVD)) or the like, but the embodiments of the invention are not limited thereto and the semiconductor layer 30 may be formed by a variety of methods.

Figure 3C:
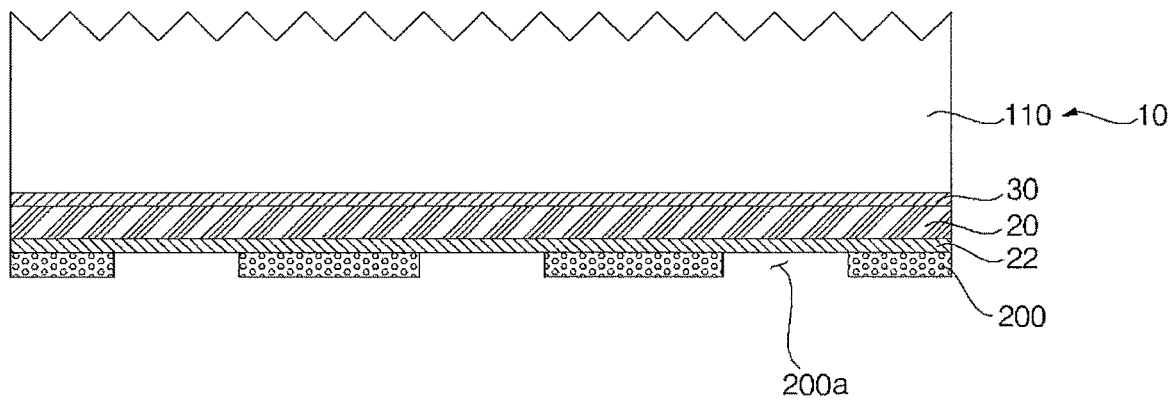

Next, as shown in FIG. 3C, a mask layer 200 having an opening 200a exposing a region corresponding to the doping area 120 is formed on the doping layer 20. The mask layer 200 may be formed by applying a layer including a variety of photoresists, but the embodiments of the invention are not limited thereto and the mask layer 200 may be formed by a variety of methods.

Figure 3D:
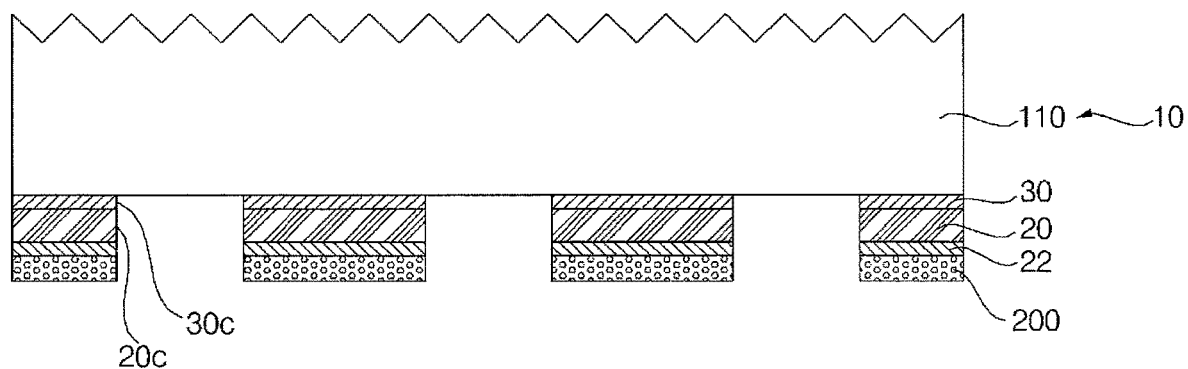

Next, as shown in FIG. 3D, the doping layer 20, the tunneling layer 30 and the barrier layer 22 are removed from the region corresponding to the opening 200a of the mask layer 200 to form openings 20c and 30c. The removal of the doping layer 20 and the tunneling layer 30 of the corresponding region may be carried out using a variety of known methods (for example, etching), but the embodiments of the invention are not limited thereto.

Figure 3E:
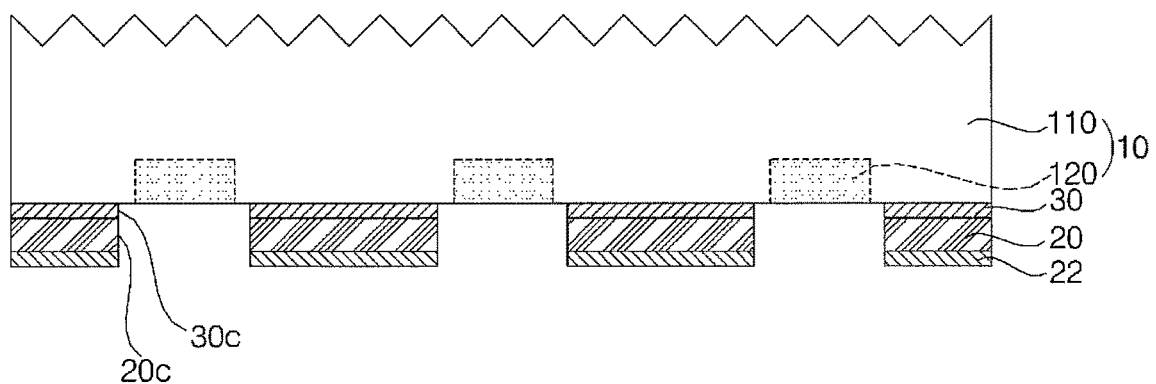

Next, as shown in FIG. 3E, a doping area 120 is formed in a region corresponding to the openings 20c and 30c by doping a first conductive-type dopant. The doping may be carried out using a variety of methods such as ion implantation or thermal diffusion.

The mask layer 200 may be removed after doping the first conductive-type dopant, but is generally removed after forming the openings 20c and 30c before completion of the formation of the doping area 120 (for example, activated thermal treatment) in order to prevent contamination by the mask layer 200. As a result, the barrier layer 22 serves as a mask and prevents incorporation of the first conductive-type dopant into the doping layer 20. In addition, the barrier layer 22 facilitates diffusion of the first conductive-type dopant into the semiconductor substrate 10.

Figure 3F:
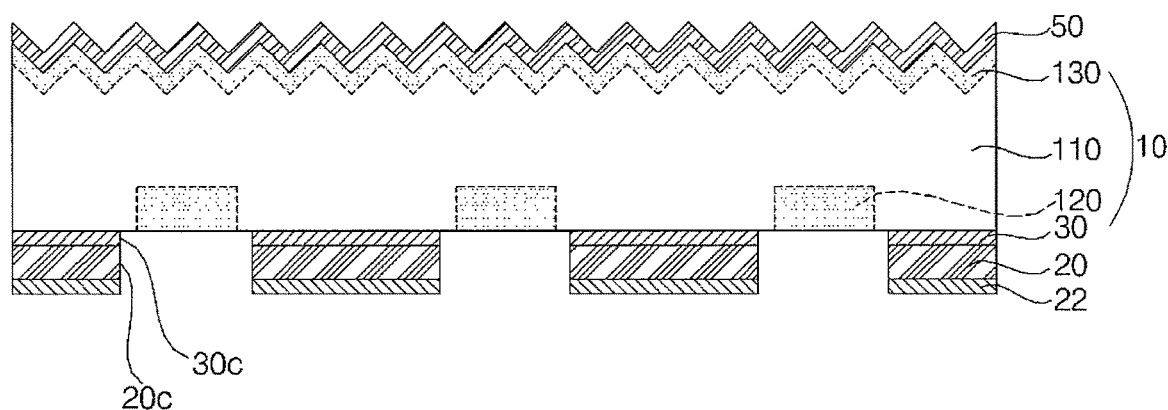

Next, as shown in FIG. 3F, a front surface field layer 130 is formed on the front surface of the semiconductor substrate 10 and an anti-reflective film 50 is formed thereon. The front surface field layer 130 may be formed by doping the semiconductor substrate 10 with a first conductive-type dopant. For example, the front surface field layer 130 may be formed by doping the semiconductor substrate 10 with a first conductive-type dopant by a variety of methods such as ion implantation or thermal diffusion. The anti-reflective film 50 may be formed by a variety of methods such as vacuum deposition, chemical vapor deposition, spin coating, screen printing or spray coating, but the embodiments of the invention are not limited thereto and various methods may be used.

Figure 3G:
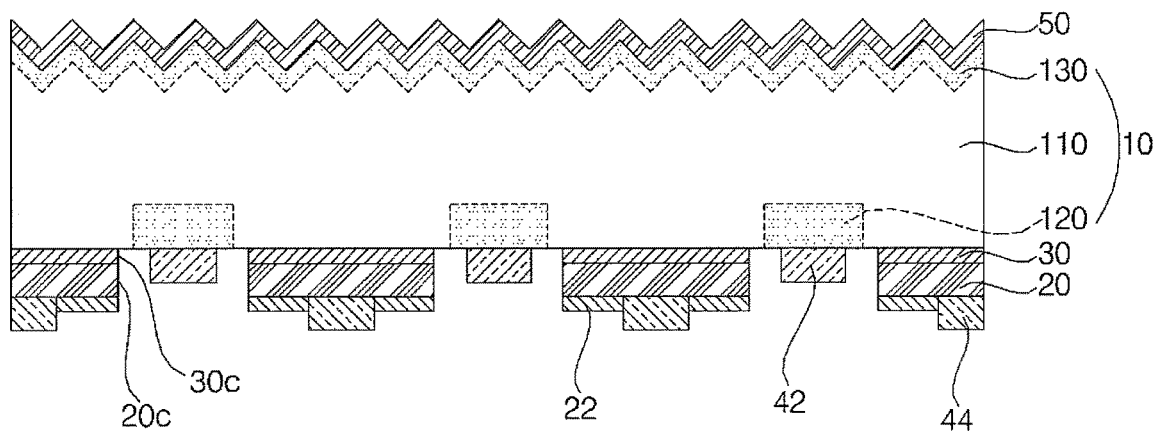

Next, as shown in FIG. 3G, first and second electrodes 42 and 44 electrically connected to the doping area 120 and the doping layer 20, respectively, are formed.

The first electrode 42 is formed by a variety of methods such as coating or deposition after forming an opening in the barrier layer 22. Alternatively, the first electrode 42 may be formed by applying a paste for forming the first electrode 42 onto the barrier layer 22 by screen printing or the like and then performing a fire through, a laser firing contact or the like thereon. In this instance, a process of separately forming openings is not required. The second electrode 44 may also be formed on the semiconductor substrate 10 (more specifically, on the doping area 120) by a variety of methods such as coating or deposition.

According to such a manufacturing method, the tunneling layer 30, the doping layer 20 and the barrier layer 22 are used as masks during formation of the doping area 120, thus advantageously requiring no additional mask process.

An example wherein the tunneling layer 30, the doping layer 20 and the barrier layer 22 are formed, the doping area 120 is formed, the front surface field layer 130 and the anti-reflective film 50 are formed, and the first and second electrodes 42 and 44 are then formed has been provided in the embodiment above, but the embodiments of the invention are not limited thereto. Accordingly, formation order of the tunneling layer 30, the doping layer 20, the barrier layer 22, the doping area 120, the front surface field layer 130, the anti-reflective film 50, and the first and second electrodes 42 and 44 may be variably changed.

A method for manufacturing the solar cell 100 according to another embodiment will be described in detail with reference to FIGS. 4A to 4I. Details of the description already given above are not repeated and only difference from the description given above is described in detail.

FIGS. 4A to 4I are sectional views illustrating a method for manufacturing a solar cell according to another embodiment of the invention.

Figure 4A:
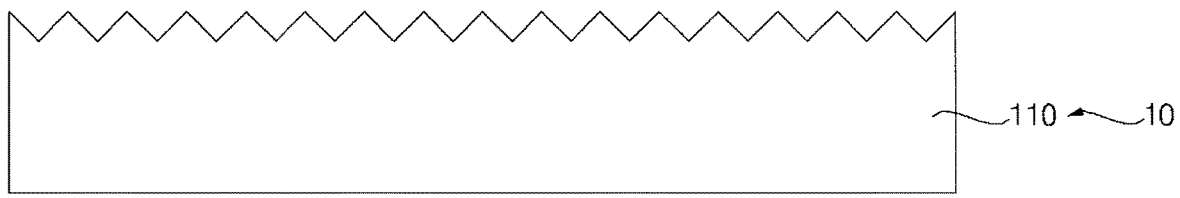
FIGS. 4A to 4I are sectional views illustrating a method for manufacturing a solar cell according to another embodiment of the invention.

First, as shown in FIG. 4A, a semiconductor substrate 10 including a base area 110 having a first conductive-type dopant is prepared in preparation of the substrate.

Figure 4B:
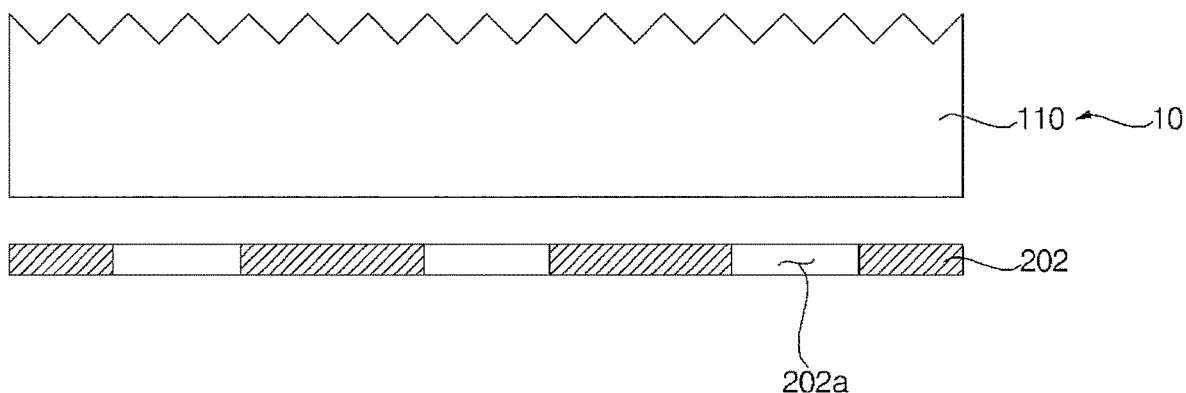
Figure 4C:
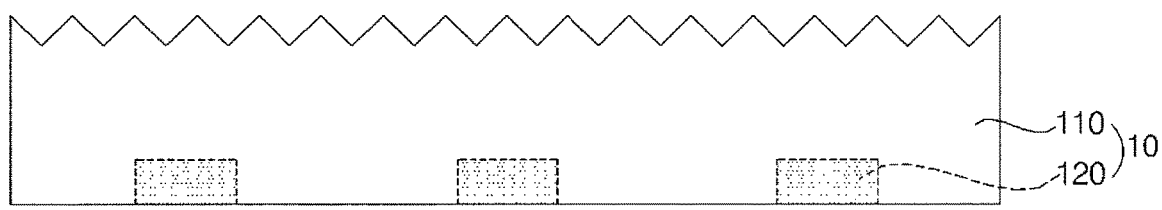

Next, as shown in FIGS. 4B and 4C, a doping area is formed on the back surface of the semiconductor substrate 10 using a mask 202 having an opening 202a. The doping area 120 is formed in the area corresponding to the opening 202a by doping a portion of the back surface of the semiconductor substrate 10 with a first conductive-type dopant while the mask 202 is placed on the back surface. The mask 202 is placed on the semiconductor substrate 10 and is, for example, a shadow mask.

Figure 4D:
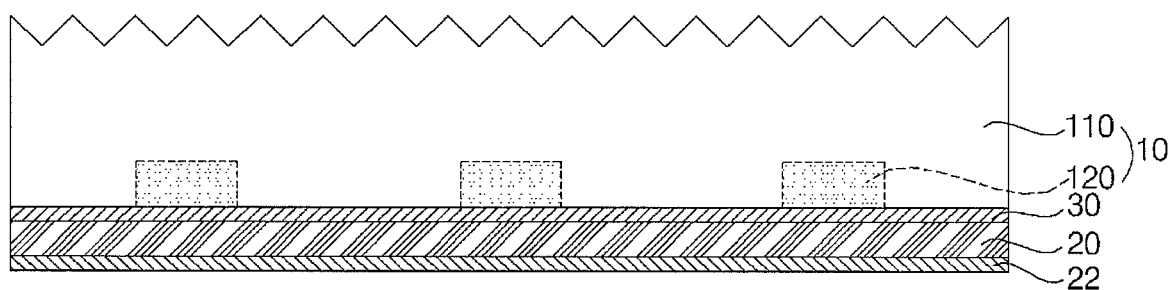

Next, as shown in FIG. 4D, a tunneling layer 30 and a doping layer 20 are formed on the back surface of the semiconductor substrate 10. At this time, a barrier layer 22 may be further formed on the doping layer 20.

Figure 4E:
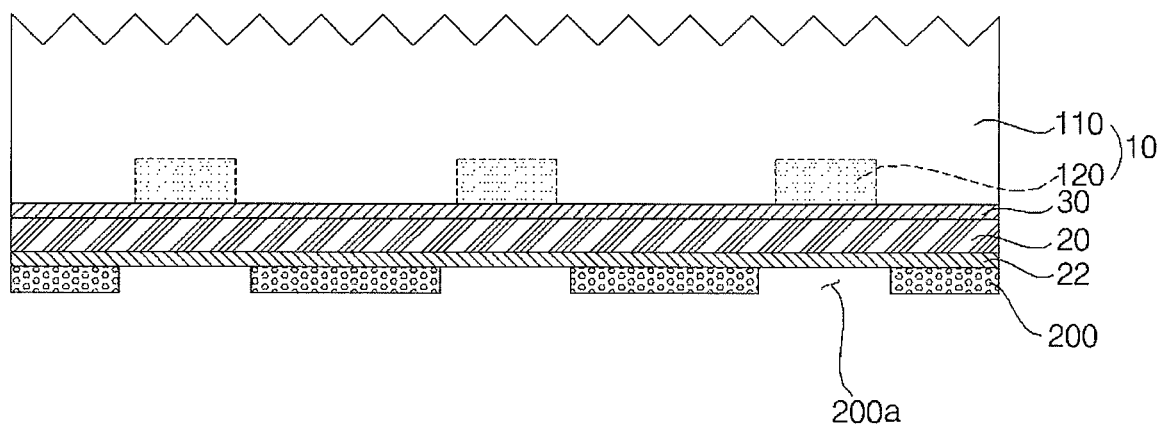

Next, as shown in FIG. 4E, a mask layer 200 having an opening 200a exposing a region corresponding to the doping area 120 is formed on the doping layer 20.

Figure 4F:
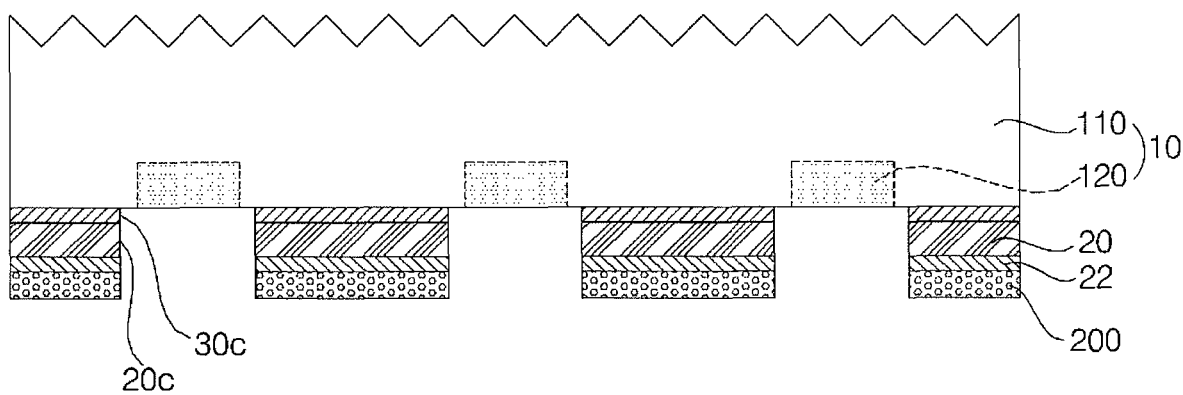

Next, as shown in FIG. 4F, the doping layer 20, the tunneling layer 30 and the barrier layer 22 are removed from the region corresponding to the opening 200a of the mask layer 200 to form openings 20c and 30c.

Figure 4G:
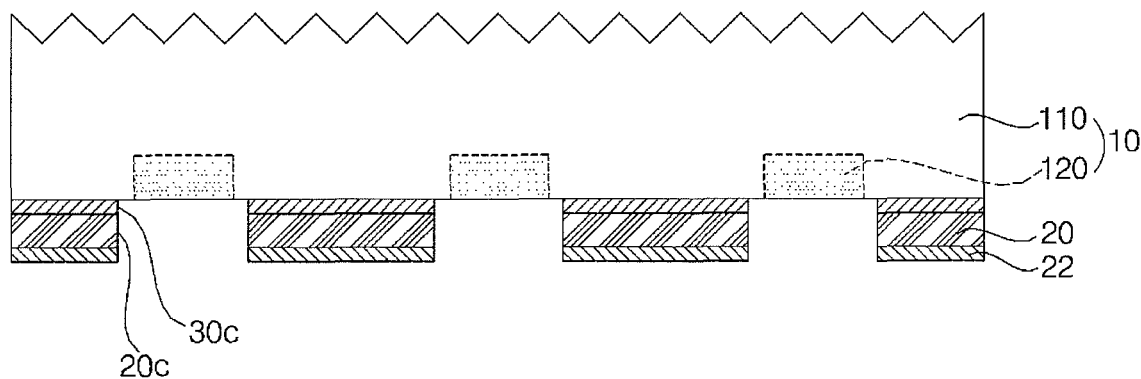

Next, as shown in FIG. 4G, the mask layer 200 is removed.

Figure 4H:
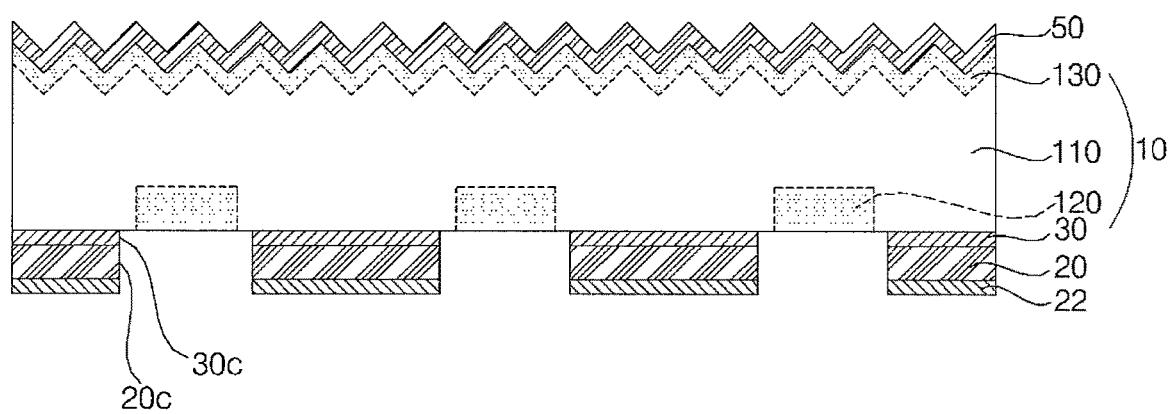

Next, as shown in FIG. 4H, a front surface field layer 130 is formed on the front surface of the semiconductor substrate 10 and an anti-reflective film 50 is formed thereon.

Figure 4I:
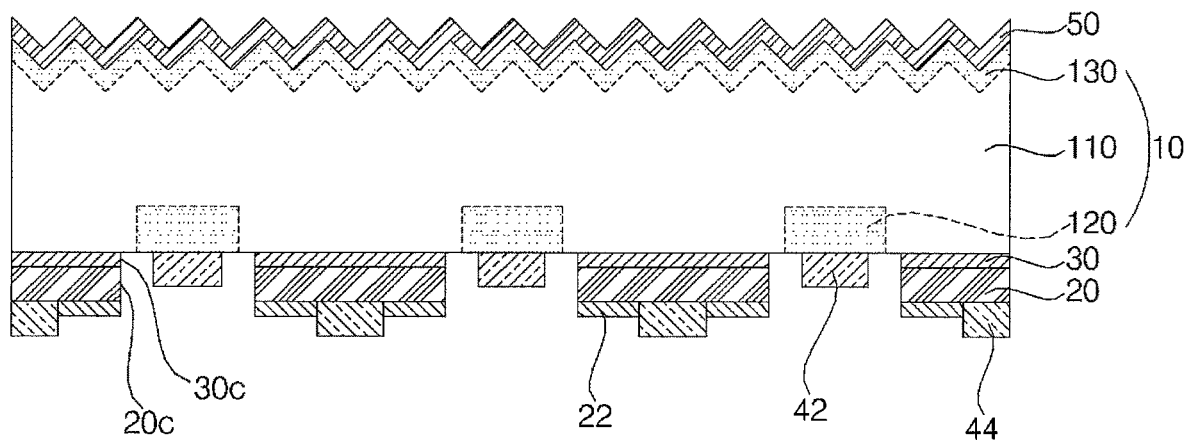

Next, as shown in FIG. 4I, first and second electrodes 42 and 44 electrically connected to the doping area 120 and the doping layer 20, respectively, are formed.

The solar cell 100 having the structure can be manufactured by a simple process according to the manufacture method of the solar cell 100, but details of the order and the method may be variably changed as described above.

Hereinafter, solar cells according to other embodiments will be described in more detail with reference to FIGS. 5 to 9. Contents of the embodiments that are the same as or similar to the embodiment described above are not described in detail and only contents different from those described above are described.

Figure 5:
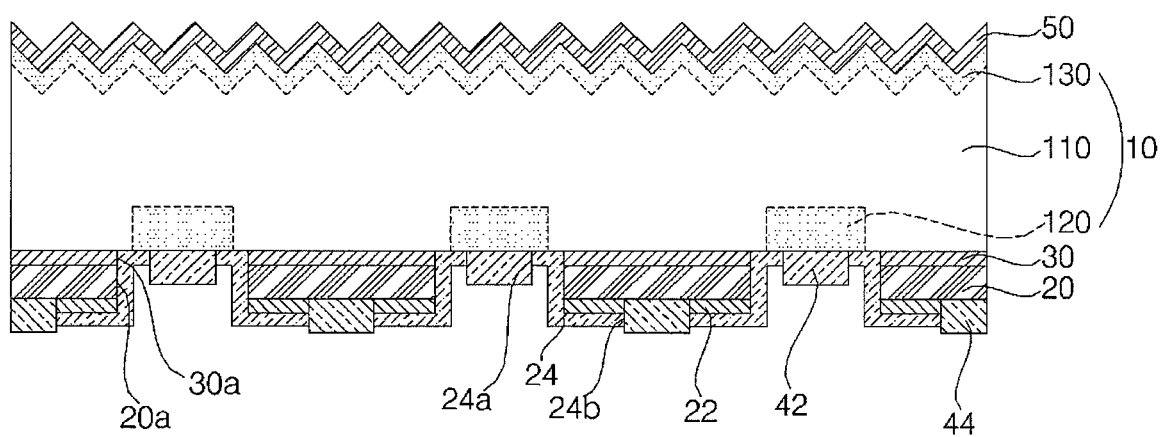
FIG. 5 is a sectional view illustrating a solar cell according to another embodiment.
Figure 6:
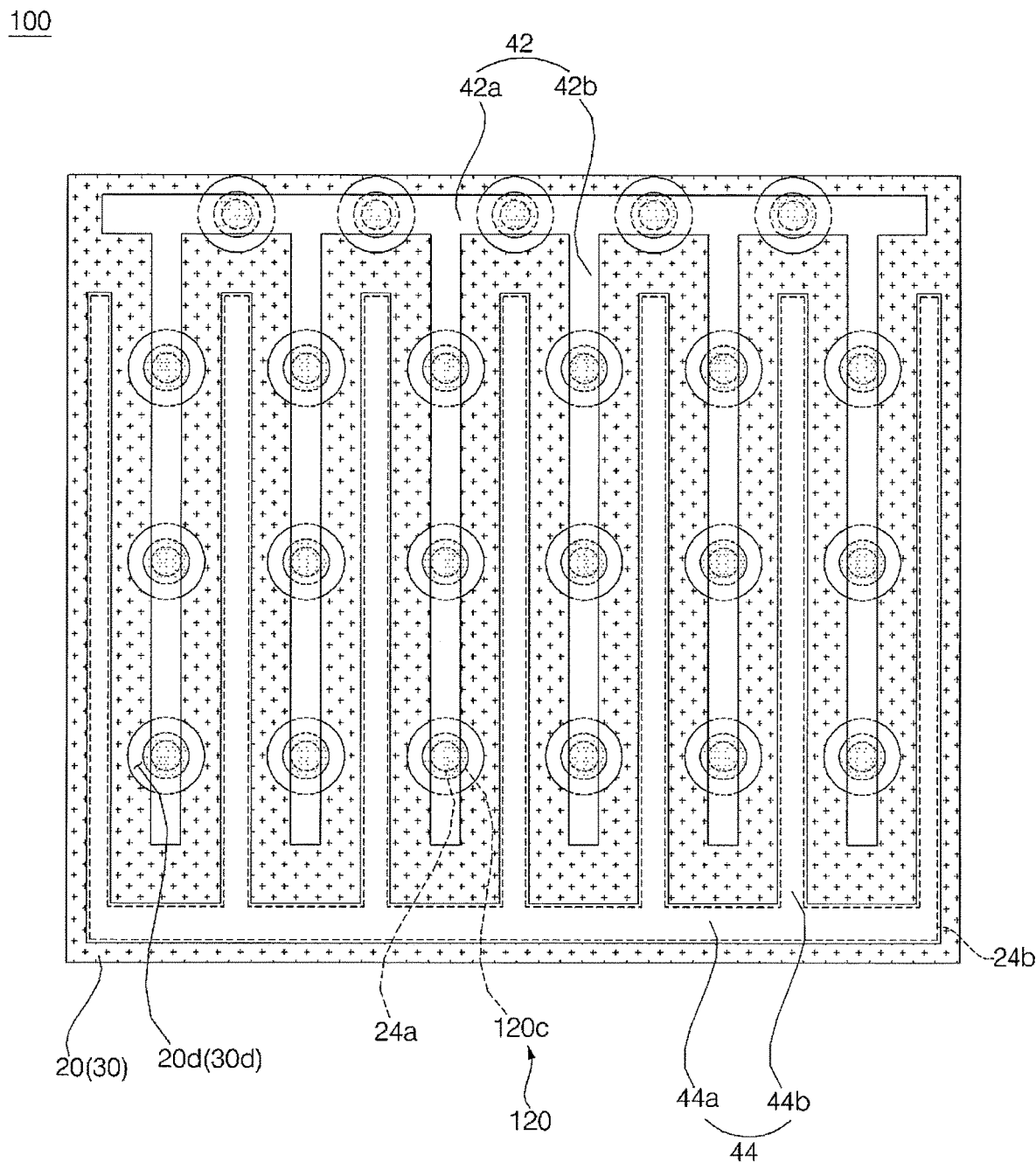
FIG. 6 is a back plan view illustrating the solar cell shown in FIG. 5.

FIG. 5 is a sectional view illustrating a solar cell according to another embodiment of the invention and FIG. 6 is a back plan view illustrating the solar cell shown in the FIG. 5. For clear illustration, the insulating layer 24 is not shown in FIG. 6.

Referring to FIGS. 5 and 6, the doping area 120 of the embodiment of the invention includes a plurality of first portions 120c connected to the first electrode 42, and the first portions 120c have an island shape. As a result, an area of the doping area 120 is minimized and the doping area 120 is entirely disposed over the semiconductor substrate 10. That is, surface recombination can be prevented or reduced and an area of the doping layer 20 can be maximized, but the embodiments of the invention are not limited thereto and the doping area 120 may have a variety of shapes capable of minimizing the area of the doping area 120.

In addition, the doping area 120 having a circular shape is shown in the drawing by example, but the embodiments of the invention are not limited thereto. Accordingly, the doping area 120 may have a plane shape including an oval or a polygon, for example, a triangle, rectangle or hexagon.

In this instance, a width or diameter of the doping area 120 may be 50 µm to 1,000 µm. When the width or diameter of the doping area 120 is less than 50 µm, electrical connection between the doping area 120 and the first electrode 42 may not be efficient and when the width or diameter thereof exceeds 1,000 µm, the area of the doping layer 20 may be decreased or a pitch between the doping area 120 may be increased. In consideration of connection to the first electrode 42, area ratio and the like, the width or diameter of the doping area 120 may be 100 µm to 500 µm, but the embodiments of the invention are not limited thereto and specific values may be varied according to conditions.

The doping layer 20 may have an entirely connected to have an integral structure and include an opening (or openings) 20d formed in a region corresponding to the first region 120c. Similar to this, the tunneling layer 30 includes openings 30d corresponding to the first regions 120c and the openings 20d, and the tunneling layer 30 except for the openings 30d is continuously connected between the doping layer and the semiconductor substrate is continuously connected to have an integral structure. When present, the barrier layer 22 may also have an opening in the corresponding region. The openings 20d and 30d of the doping layer 20 and the tunneling layer 30 may be wider than the first region 120c and the first region 120c may be entirely disposed in the openings 20d and 30d, but the embodiments of the invention are not limited thereto and various modifications are possible.

An insulating layer 24 for insulating the doping area 120 from the doping layer 20 may be formed on the semiconductor substrate 10 including the doping area 120 and the doping layer 20 (or barrier layer 22). A first contact hole 24a for connecting the first electrode 42 to the first region 120c of the doping area 120, and a second contact hole 24b for connecting the second electrode 44 to the doping layer 20 may be formed in the insulating layer 24. In this instance, the first contact hole 24a may be formed to have an island shape in a region that corresponds to the first region 120c and the second contact hole 24b may have a shape entirely the same as or similar to the second electrode 44 according to the shape of the second electrode 44. That is, the second contact hole 24b may have portions corresponding to the stem portion 44a and the branch portion 44b. As such, the first contact hole 24a and the second contact hole 24b may have different shapes in consideration of the doping area 120 having an island region and the entirely connected shape of the doping layer 20. As a result, electrical connection of the first electrode 42 and the doping area 120 having an island shape is efficiently secured, and insulation between the first electrode 42 and the doping layer 20 is stably maintained. In addition, the second electrode 44 entirely contacts the doping layer 20, thereby improving carrier resin efficiency, but the embodiments of the invention are not limited thereto and shapes of the first and second contact holes 24a and 24b may be changed.

An example in which the first electrode 42 has the same shape as in the embodiment shown in FIG. 1 has been given in the embodiment of the invention, but the shape of the first electrode 42 or the like may be varied. A modified embodiment will be described with reference to FIG. 7.

Figure 7:
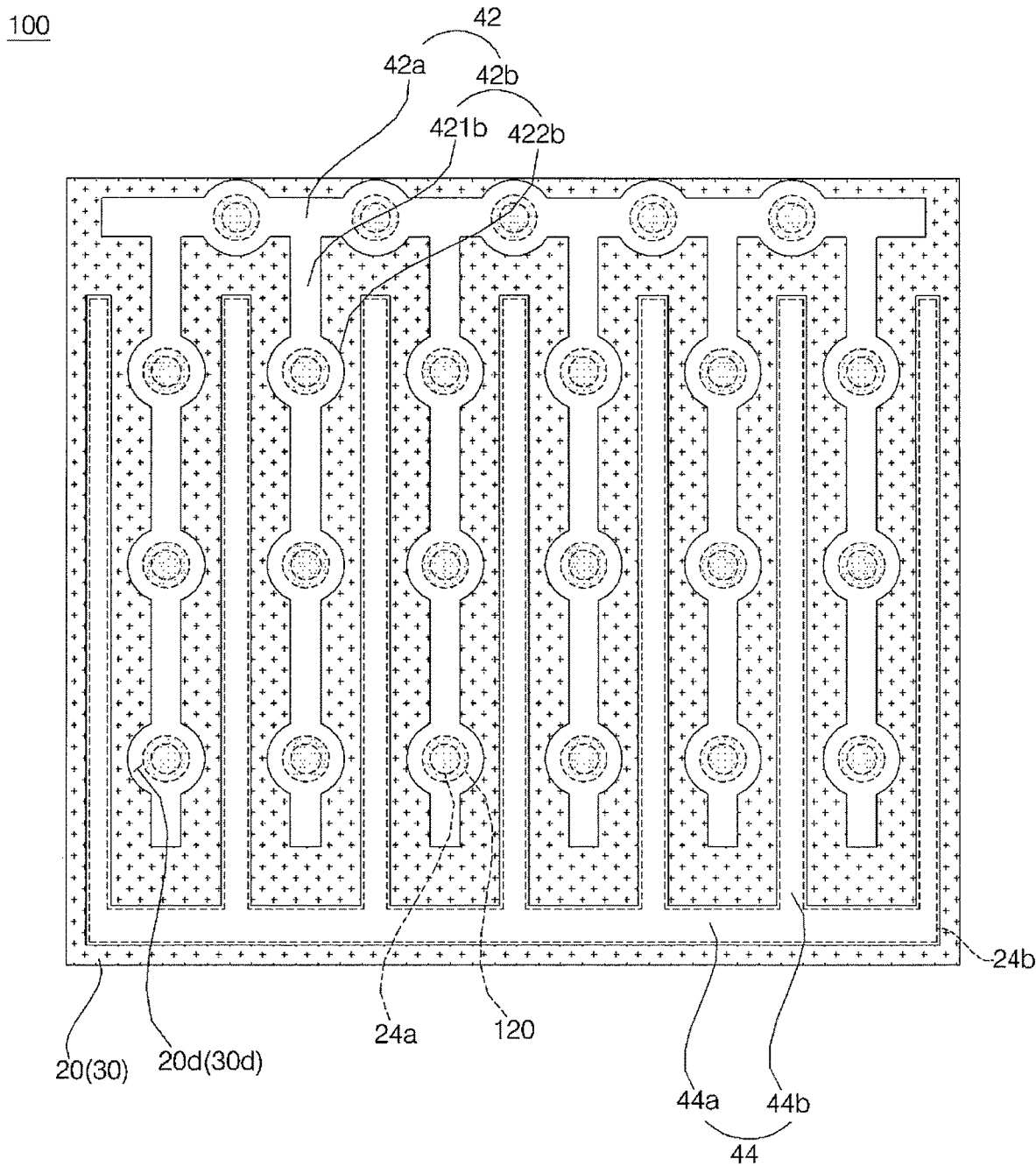
FIG. 7 is a back plan view illustrating a solar cell according to a modified embodiment of the invention.

FIG. 7 is a back plan view illustrating a solar cell according to the modified embodiment of the invention.

Referring to FIG. 7, the branch portion 42b of the first electrode 42 may include a plurality of first portions 421b corresponding to the first region 120c of the doping area 120, and a second portion 422b which connects the first portions 421b to one another and has a smaller width than each first portion 421b. That is, the width of the first portion 421b corresponding to the first region 120c is greater than widths of other portions, thereby sufficiently securing areas of the respective first portions 120c, or areas of contact holes 24 connecting the first electrode 42 to the first region 120c. As a result, electrical connection between the first electrode 42 and the first region 120c can be further facilitated.

The method for manufacturing the solar cell 100 shown in FIGS. 5 to 7 will be described in detail with reference to FIGS. 8A to 8C. Contents of the embodiments that are the same as or similar to the embodiment described above are not described in detail with reference to FIGS. 3A to 3G, and FIGS. 4A to 4I and only contents different from those described above are described.

Figure 8A:
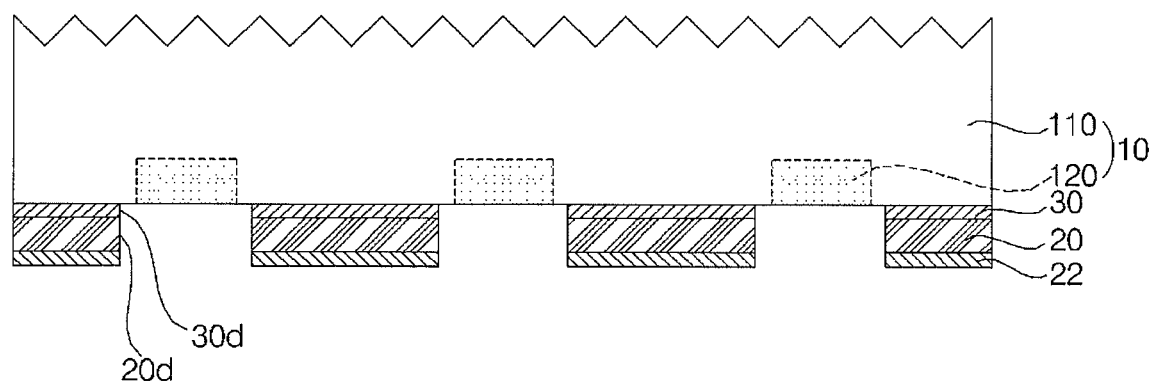
FIGS. 8A to 8C are sectional views illustrating a method for manufacturing a solar cell according to another embodiment.
Figure 8B:
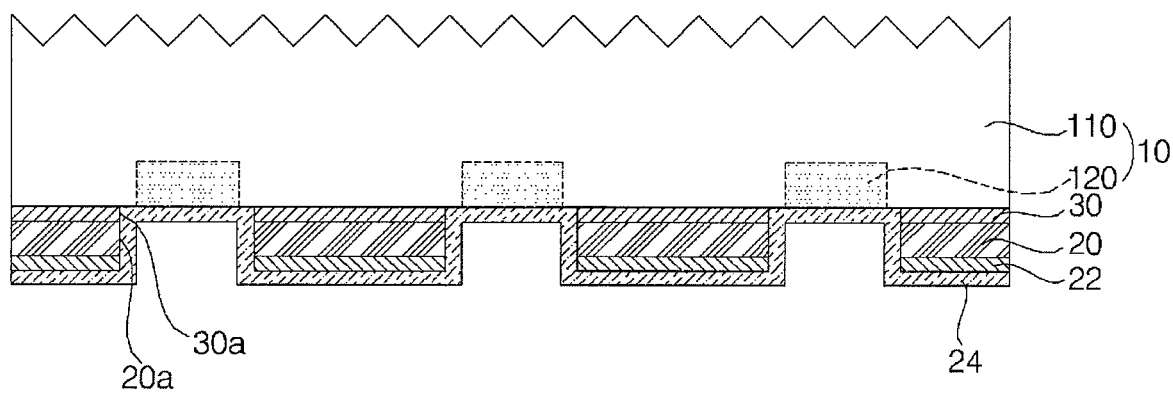
Figure 8C:
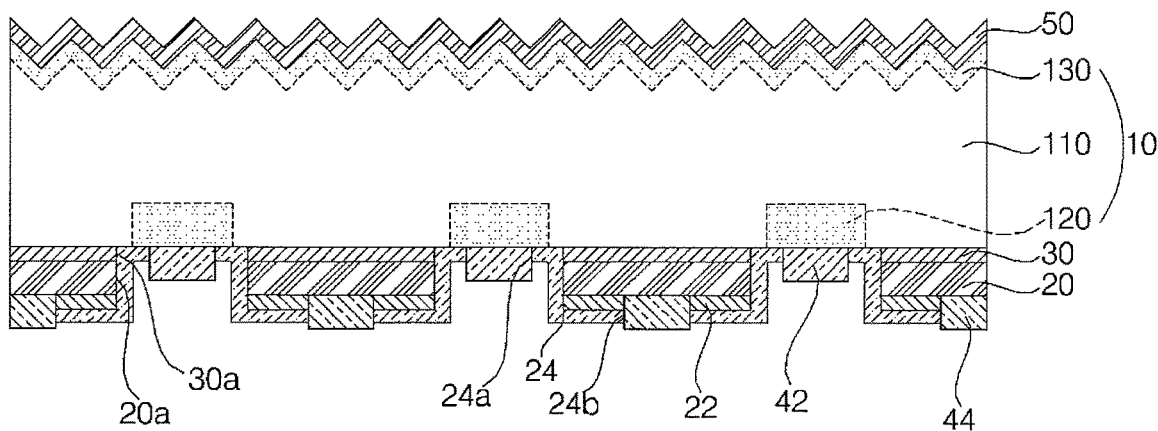

FIGS. 8A to 8C are sectional views illustrating a method for manufacturing a solar cell according to another embodiment of the invention.

As shown in FIG. 8A, a doping area 120 is formed on the semiconductor substrate 10 and a tunneling layer 30, a doping layer 20 and a barrier layer 22 having openings 30d and 20d are formed on the semiconductor substrate 10.

Next, as shown in FIG. 8B, an insulating layer 24 is formed over the entire surface of the structure including the semiconductor substrate 10, the tunneling layer 30, the doping layer 20 and the barrier layer 22. The insulating layer 24 may include a variety of insulating materials (for example, oxides, nitrides or the like) and may be formed by a variety of methods such as vacuum deposition, chemical vapor deposition, spin coating, screen printing or spray coating, but the embodiments of the invention are not limited thereto and various methods may be used.

Next, as shown in FIG. 8C, a front surface field layer 130 and an anti-reflective film 50 are formed on the front surface of the semiconductor substrate 110. In addition, first and second electrodes 42 and 44 electrically connected to the doping area 120 and the doping layer 20 through a first contact hole 24a and a second contact hole 24b are formed.

The solar cell 100 having the structure described above can be formed by such a manufacturing method.

Figure 9:
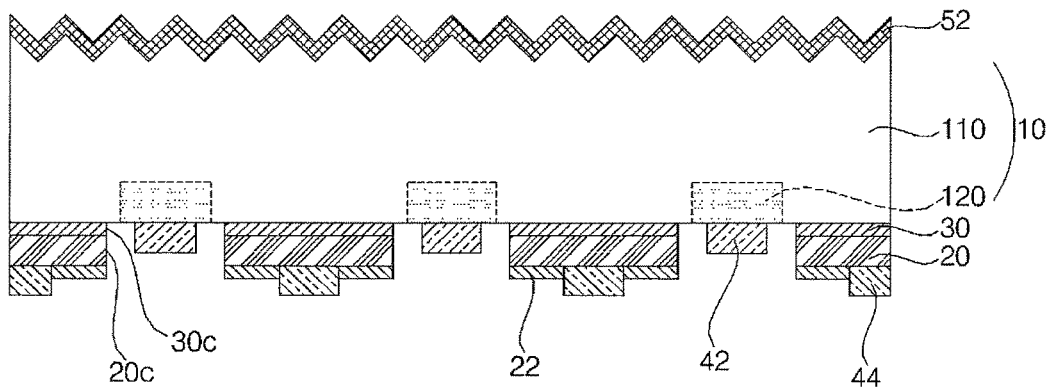
FIG. 9 is a sectional view illustrating a solar cell according to another embodiment of the invention.

FIG. 9 is a sectional view illustrating a solar cell according to another embodiment of the invention.

Referring to FIG. 9, in the solar cell according to the embodiment, the semiconductor substrate 10 includes only the base area 110 and does not include an additional front surface field layer (represented by reference numeral "130" in FIG. 1, the same will be applied below). Instead, a field effect-forming layer 52 which contacts the base area 110 of the semiconductor substrate 10 and has a fixed charge is formed. Similar to the front surface field layer 130, the field effect-forming layer 52 generates a certain field effect and thereby prevents or reduces surface recombination. The field effect-forming layer 52 may be composed of aluminum oxide having a negative charge, or silicon oxide or silicon nitride having a positive charge or the like. Although not additionally shown, an additional anti-reflective film (represented by reference numeral "50" in FIG. 1) may be further formed on the field effect-forming layer 52.

As such, in the embodiment of the invention, the area of the doping area formed in the semiconductor substrate 10 is greatly reduced and the overall process is thus simplified. In addition, damage to the semiconductor substrate 10 which may be generated during formation of the doping area can be efficiently reduced.

In this instance, an amount of fixed charges of the field effect-forming layer 52 is for example, $1 \times 10^{12}/cm^2$ to $9 \times 10^{13}/cm^2$. The amount of the fixed charges is a level enabling generation of the field effect in the semiconductor substrate 10 not including the doping area. More specifically, in consideration of the field effect, the amount of fixed charges may be $1 \times 10^{12}/cm^2$ to $1 \times 10^{13}/cm^2$, but the embodiments of the invention are not limited thereto and the amount of fixed charges may be varied.

In this instance, the base area 110 not including the doping area may have a specific resistance of 0.5 ohm·cm to 20 ohm·cm (for example, 1 ohm·cm to 15 ohm·cm). Accordingly, in a region adjacent to the field effect-forming layer 52, the semiconductor substrate 10 may have a specific resistance of 0.5 ohm·cm to 20 ohm·cm (for example, 1 ohm·cm to 15 ohm·cm). However, this specific resistance range is given as an example of an instance when the semiconductor substrate 10 includes an n-type base area 110 using phosphorous (P) as a dopant and may be changed according to conductive type, dopant type or the like.

Although the embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A solar cell comprising:
    a semiconductor substrate having a front surface and a rear surface; the semiconductor substrate having a monocrystalline structure and a first conductive type; a doping area formed in the rear surface of the semiconductor substrate by diffusing a first dopant having the first conductive type; the doping area having a higher dopant concentration than a dopant concentration of the semiconductor substrate; the doping area having a same crystalline structure as the semiconductor substrate;
    a doping layer formed on the rear surface of the semiconductor substrate and having a micro-crystalline or polycrystalline structure, the doping layer having a second dopant having a second conductive type different from the first conductive type;
    a tunneling layer interposed between the doping layer and the rear surface of the semiconductor substrate;
    an insulating layer contacted to a rear surface of the doping area and to the doping layer and having a first opening on the doping area and a second opening on the doping layer;
    wherein the insulating layer is a continuous layer except at the first and second openings;
    a barrier layer positioned on the doping layer between the doping layer and the insulating layer;
    a first electrode connected to the doping area through the first opening; and
    a second electrode directly contacting the doping layer through the second opening through the barrier layer and the insulating layer;
    wherein the semiconductor substrate further includes an interval region formed of a base area of the semiconductor substrate, the interval region having a lower dopant concentration than that of the doping area and positioned between the doping area and the doping layer to separate the doping area and the doping layer;
    a third opening, comprising the first opening, and corresponding to the doping area and the interval region, wherein each of the barrier layer, the doping layer, and the tunneling layer are continuous layers except at the third opening;
    wherein the doping layer and the tunneling layer each contact the insulating layer at a plane which corresponds to an end of the interval region, the plane being perpendicular to a plane which is parallel to the rear surface of the semiconductor substrate;
    wherein the interval region is covered by the insulating layer, and not the barrier layer, in a direction perpendicular to the plane which is parallel to the rear surface of the semiconductor substrate.

2. The solar cell according to claim 1, wherein the tunneling layer has a thickness of 0.5 nm to 5 nm.

3. The solar cell according to claim 1, wherein the tunneling layer comprises at least one of oxides, nitrides and conductive polymers.

4. The solar cell according to claim 1, wherein the first conductive type is n-type, and the second conductive type is p-type.

5. The solar cell according to claim 1, wherein a total area of the doping layer is larger than a total area of the doping area.

6. The solar cell according to claim 5, wherein a ratio of the total area of the doping area to the total area of the semiconductor substrate is 0.5% to 30%.

7. The solar cell according to claim 6, wherein the ratio of the total area of the doping area to the total area of the semiconductor substrate is 0.5% to 5%.

8. The solar cell according to claim 1, wherein a thickness of the doping layer is greater than a thickness of the tunneling layer.

9. The solar cell according to claim 8, wherein the thickness of the tunneling layer is 0.5 nm to 5.0 nm and the thickness of the doping layer is 50 nm to 250 nm.

10. The solar cell according to claim 1, wherein the doping area comprises a plurality of first regions connected to the first electrode.

11. The solar cell according to claim 1, wherein the doping area comprises a plurality of first regions connected to the first electrode, and a second region having a smaller width than a width of each of the first regions of the plurality of first regions, the second region connected to the plurality of first regions;

or the doping area comprises a plurality of branch portions parallel to each other to have a stripe pattern.

12. The solar cell according to claim 1, wherein the tunneling layer has a shape corresponding to the doping layer.

13. The solar cell according to claim 1, wherein the second electrode comprises a metal layer.

14. The solar cell according to claim 1, wherein the doping layer and the rear surface of the semiconductor substrate form a tunnel junction at the tunneling layer.

\* \* \* \* \*